(12) United States Patent
Yano et al.

(10) Patent No.: US 6,723,572 B2
(45) Date of Patent: Apr. 20, 2004

(54) METHOD FOR MONITORING THE SHAPE OF THE PROCESSED SURFACES OF SEMICONDUCTOR DEVICES AND EQUIPMENT FOR MANUFACTURING THE SEMICONDUCTOR DEVICES

(75) Inventors: Hiroyuki Yano, Yokohama (JP); Katsuya Okumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 193 days.

(21) Appl. No.: 10/139,278

(22) Filed: May 7, 2002

(65) Prior Publication Data

US 2004/0048399 A1 Mar. 11, 2004

Related U.S. Application Data

(60) Continuation of application No. 09/846,372, filed on May 2, 2001, now Pat. No. 6,414,499, which is a division of application No. 09/289,061, filed on Apr. 12, 1999, now Pat. No. 6,306,669.

(30) Foreign Application Priority Data

Apr. 17, 1998 (JP) .......................................... 10-107689

(51) Int. Cl.[7] .............................................. H01L 21/66
(52) U.S. Cl. ...................................................... 438/14
(58) Field of Search ........................ 438/14; 250/201.5, 250/310, 306

(56) References Cited

U.S. PATENT DOCUMENTS

| 5,270,222 | A | 12/1993 | Moslehi | 438/8 |
| 5,658,418 | A | 8/1997 | Coronel | 156/345 |
| 5,923,999 | A | 7/1999 | Balasubraman et al. | 438/592 |
| 6,019,850 | A | 2/2000 | Frey | 118/719 |
| 6,202,037 | B1 | 3/2001 | Hattori | 702/182 |
| 6,271,047 | B1 * | 8/2001 | Ushio | 438/14 |

FOREIGN PATENT DOCUMENTS

JP 10-47926 2/1998

* cited by examiner

Primary Examiner—John F. Niebling
Assistant Examiner—Andre C Stevenson
(74) Attorney, Agent, or Firm—Finnegan, Henderson, Farabow, Garrett & Dunner, L.L.P.

(57) ABSTRACT

A to-be-polished surface of a semiconductor workpiece is polished to a target shape, using a CMP tool. The to-be-polished surface is a surface of a metal provided on an insulating film having trenches. A shape of a polished surface of the semiconductor workpiece is monitored to determine if a metal residue exists outside of the trenches on the polished surface while the semiconductor workpiece is set in the CMP tool, using a monitor. The monitor has a sensor that obtains a two-dimensional image of the to-be-polished surface. The CMP tool is controlled by feedback based on a result of monitoring to determine if the metal residue exists, using a controller.

17 Claims, 10 Drawing Sheets

| PRESSURE [mTorr] | TRENCHING [nm] | ETCHING RATE [nm/min] | | SELECTIVITY [RESIST :SiO2] | UNIFORMITY [%] |
|---|---|---|---|---|---|
| | | 0.2 μm | 100 μm | | |
| 20 | 40 | 390 | 380 | 1.5 | ±5 |
| 40 | 30 | 395 | 400 | 1.7 | ±3 |
| 60 | 25 | 400 | 415 | 1.8 | ±5 |
| 80 | 10 | 410 | 430 | 1.8 | ±7 |

METHOD FOR MONITORING THE SHAPE OF THE PROCESSED SURFACES OF SEMICONDUCTOR DEVICES AND EQUIPMENT FOR MANUFACTURING THE SEMICONDUCTOR DEVICES

CROSS-REFERENCE TO RELATED APPLICATIONS

This application is a continuation of application Ser. No. 09/846,372, filed May 2, 2001 now U.S. Pat. No. 6,414,499 which is a divisional of application Ser. No. 09/289,061, filed Apr. 12, 1999, issued as U.S. Pat. No. 6,306,669 on Oct. 23, 2001, the entire contents of which applications are hereby incorporated by reference in their entirety.

This application is based upon and claims the benefit of priority from the prior Japanese Patent Application No. 10-107689, filed Apr. 17, 1998, the entire contents of which are incorporated herein by reference.

BACKGROUND OF THE INVENTION

This invention relates to a method for monitoring the shape of the processed surfaces of semiconductor devices, and an equipment with a monitor for manufacturing such semiconductor devices.

In a process equipment for changing the shape of a processed surface, using chemical vapor deposition (CVD) and chemical mechanical polishing (CMP), etc., the condition of a processed surface, for example, the thickness of a thin film formed on the surface, is measured after the shape changing process.

FIG. 1 is a block diagram showing the structure of a measuring apparatus as the background art of the present invention.

As is shown in FIG. 1, a light source 101 emits incoherent light. The emitted light strikes upon a measurement point of the processed surface of a wafer 100 via a half mirror 102 and a lens 103. Then, the light reflects therefrom and enters a spectroscope 104 via the lens 103 and the half mirror 102. The spectroscope 104 divides the reflected light and emits light beams of different wavelengths to the pixels of a linear image sensor (one-dimensional CCD) 105. The linear image sensor 105 outputs, to a data processor 106, data on the intensities of the light beams of the pixels, i.e. the intensity of a light beam of each wavelength. The data processor 106 calculates the thickness of the wafer at the measurement point from the light intensity of each pixel. Thus, the thickness of the thin film formed on the processed surface can be measured.

However, when silicon dioxide is deposited on the to-be-processed surface of a wafer, which has a step, using, for example, a plasma-assisted CVD (P-CVD) tool, the resultant silicon dioxide film on the wafer has an uneven thickness. This is because a microscopic loading effect has occurred. This kind of thickness unevenness cannot be detected from the measurement of the thickness of only one portion of the wafer. Accordingly, even when the thickness of the measurement point is detected, it is difficult to feed the measurement result, as useful process control information, back to the actual process. The same can be said of any other film forming methods, as well as the P-CVD method.

A similar disadvantage to the above may also occur when the to-be-processed surface is etched or polished. For example, in reactive ion etching (RIE), trenching may occur, where a formed trench does not have a uniform depth. In CMP, dishing may occur, where the polished surface of the wafer is not uniformly flat.

Moreover, if in the case of a damascene process using CMP, a convex portion has an uneven surface, so-called "metal residue" occurs where a metal wiring material remains on a lower surface of the convex portion, thereby short-circuiting adjacent wires. To detect the "metal residue", inspection must be performed using an expensive low-throughput defect-inspecting device, or by the operator looking through an optical microscope. It is impossible during the inspection to subject the wafer to the next process, and hence a longer time and a greater manufacturing cost are required for the entire process.

BRIEF SUMMARY OF THE INVENTION

In accordance with the invention, there is provided a method for manufacturing a semiconductor device according to an aspect of the present invention comprises: polishing a to-be-polished surface of a semiconductor workpiece to a target shape, using a CMP tool, the to-be-polished surface being a surface of a metal on an insulating film having trenches; monitoring a shape of a polished surface of the semiconductor workpiece to determine if a metal residue exists outside of the trenches on the polished surface while the semiconductor workpiece is set in the CMP tool, using a monitor having a sensor that obtains a two-dimensional image of the to-be-polished surface; and controlling the CMP tool in a feedback manner based on a result of monitoring to determine if the metal residue exists using a controller.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DETAILED DESCRIPTION OF THE INVENTION

Figure 4:
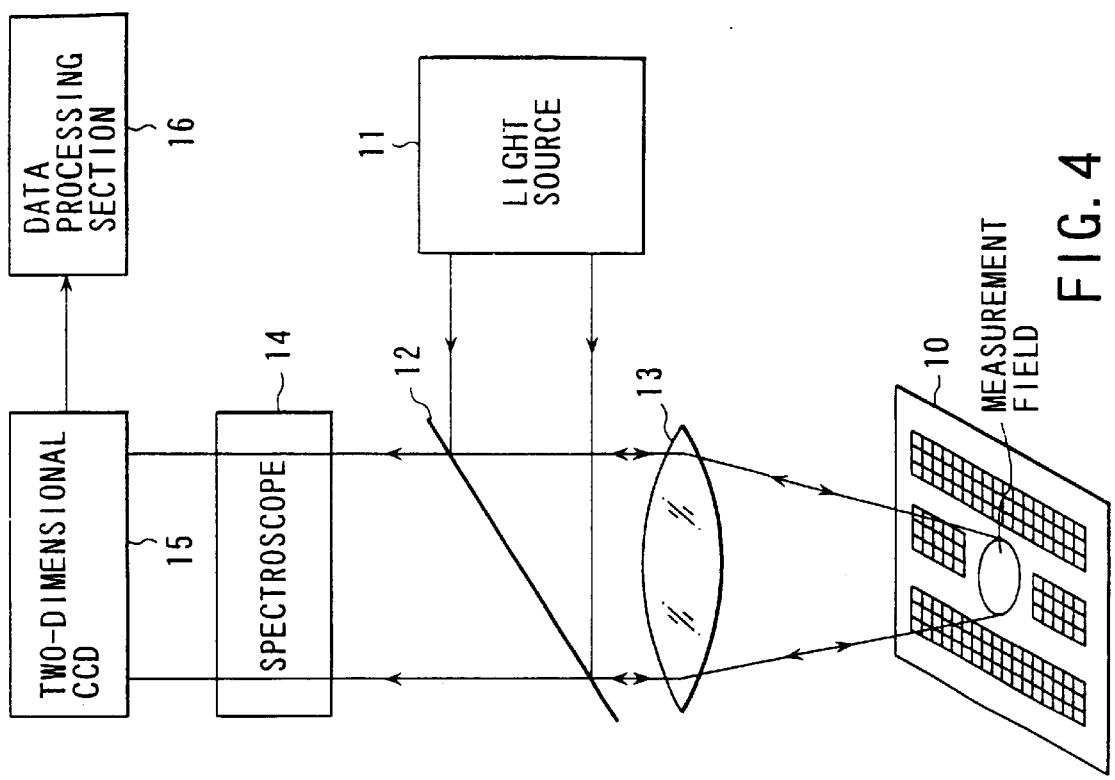
FIG. 4 is a block diagram showing an example of a measurement apparatus incorporated in the manufacturing equipment according to the first embodiment.

The embodiments of the invention will be described with reference to the accompanying drawings. In the drawings, like reference numeral denotes like element.

First Embodiment

Figure 2:
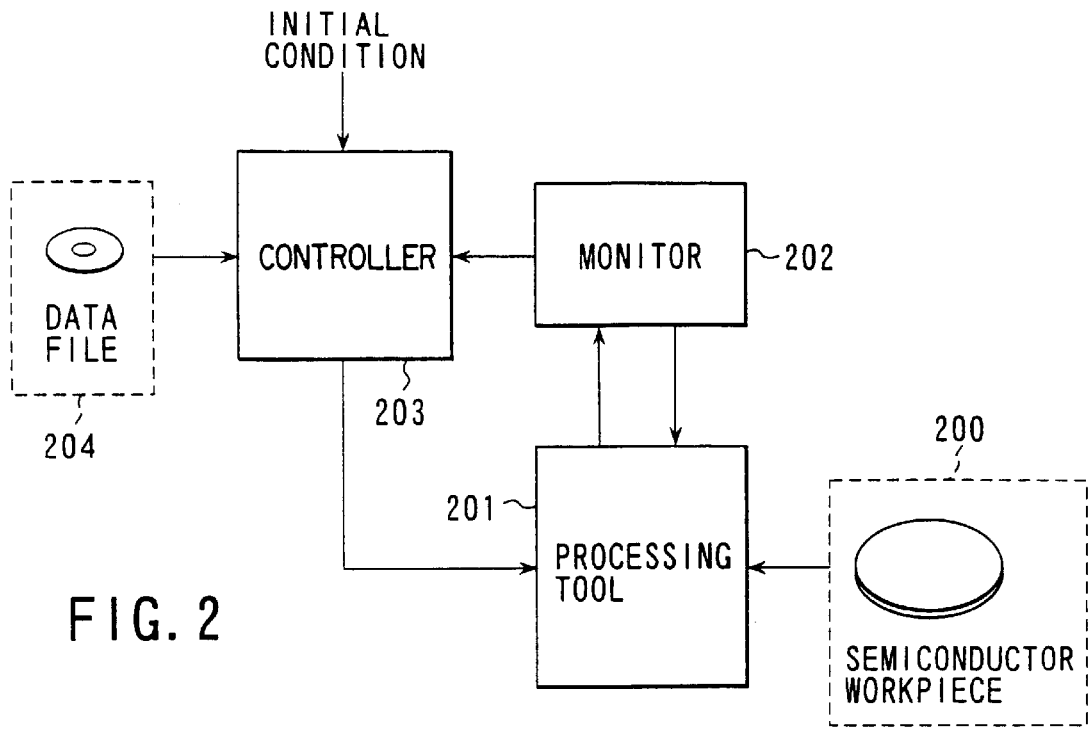
FIG. 2 is a block diagram showing the structure of an equipment for manufacturing a semiconductor device according to a first embodiment of the invention.

FIG. 2 is a block diagram showing an equipment for manufacturing a semiconductor device according to a first embodiment of the invention.

As is shown in FIG. 2, the manufacturing equipment comprises a processing tool 201, a monitor 202 and a controller 203.

Figure 3A:
FIGS. 3A, 3B, 3C and 3D are sectional views showing semiconductor workpieces.
Figure 3B:
Figure 3C:
Figure 3D:

A semiconductor workpiece 200 is loaded into the processing tool 201 and set in it. The processing tool 201 processes the to-be-processed surface of the workpiece 200 to a target condition. Specifically, a thin film is provided on the to-be-processed surface, a trench is formed in the to-be-processed surface, or the to-be-processed surface is planarized. Accordingly, the processing tool 201 is selected from a P-CVD tool, a RIE tool, a CMP tool, etc. in accordance with a target shape or condition. Further, since the semiconductor workpiece 200 is a semi-product, it can assume various states, such as a state as shown in FIG. 3A in which no process is performed on a semiconductor wafer (e.g. a silicon wafer) 10, a state as shown in FIG. 3B in which a photoresist pattern 23 is formed on an insulating film 22 formed of, for example, a silicon dioxide film, a state as shown in FIG. 3C in which trenches 24 are formed in the insulating film 22, and a state as shown in FIG. 3D in which a metal film 25, e.g. a copper film, is provided on the insulating film 22 with the trenches 24 formed therein.

The monitor 202 three-dimensionally monitors the shape of the processed surface of the workpiece 200 set in the processing tool 201. The controller 203 controls the processing tool 201 in a feedback manner on the basis of the shape of the processed surface monitored by the monitor 202.

FIG. 4 is a block diagram showing an example of a measurement apparatus incorporated in the manufacturing equipment according to the first embodiment.

As is shown in FIG. 4, a light source 11 emits incoherent light. The incoherent light is, for example, white light. The emitted light strikes upon and reflects from a measurement field of the processed surface of a wafer 10 via a half mirror 12 and a lens 13. The size of the measurement field is, for example, 3 mm×3 mm. Then, the light reflects therefrom and enters a spectroscope 14 via the lens 13 and the half mirror 12. The spectroscope 14 divides the reflected light and emits only particular wavelength components of the reflected light to an area image sensor (2-dimensional CCD) 15. The spectroscope 14 changes the wavelength of the emitted light over time. The area image sensor 15 receives the light components from the spectroscope 14, using a plurality of pixels, thereby outputting, to a data processor 16, signals corresponding to the intensities of the light components. The data processor 16 measures the shape of the measurement field, for example, the thickness of a film provided on the measurement field, using differences in intensity between the wavelength components received by the pixels. Each pixel of the area image sensor 15 corresponds to each portion of the wafer 10. Accordingly, the measurement of the film thickness for each pixel means the measurement of the thickness distribution of the thin film provided on the measurement field. Thus, the data processor 16 analyzes the thickness distribution of the thin film, and transmits information on the analysis results to a controller 203. The controller 203 uses the received information to control the processing tool 201. The measurement of the thickness distribution can be performed either during the processing or after the processing.

A description will now be given of a specific example of a process performed by the manufacturing equipment according to the first embodiment. This process relates to a damascene process, and in particular, to a process for forming a wiring trench for providing damascene wiring.

FIGS. 5A–5F are sectional views useful in explaining a process performed by the manufacturing equipment of the first embodiment.

Figure 5A:
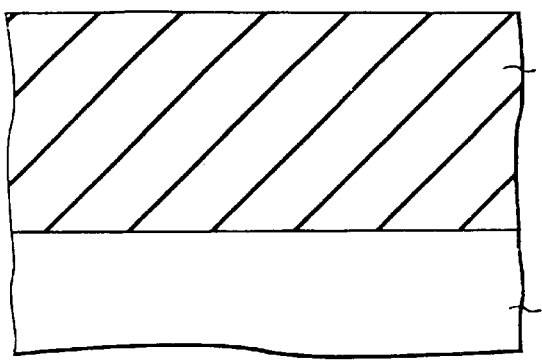
FIGS. 5A, 5B, 5C, 5D, 5E and 5F are sectional views useful in explaining a process performed by the manufacturing equipment of the first embodiment.

FIG. 5A shows a state in which a interlayer insulating film 22 made of, for example, silicon dioxide is formed on the silicon wafer 10.

Figure 5D:
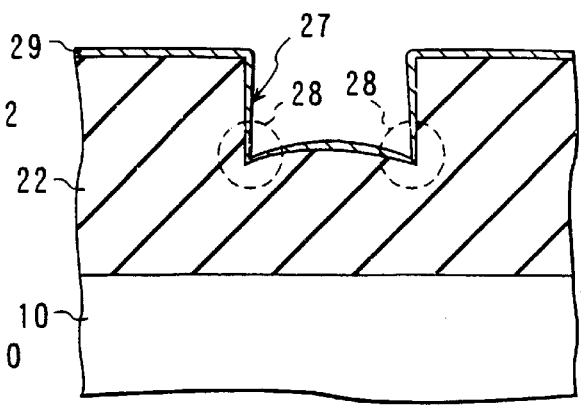
Figure 5B:
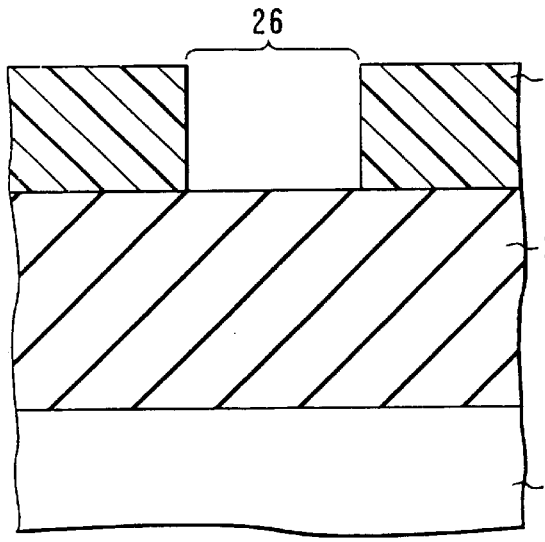

After that, the interlayer insulating film 22 is coated with photoresist to thereby form a photoresist film 23, as is shown in FIG. 5B. Then, the photoresist film 23 is exposed and developed to thereby form an opening 26 corresponding to a wiring pattern. Thereafter, a process for forming a wiring trench for the damascene wiring is performed.

Figure 6:
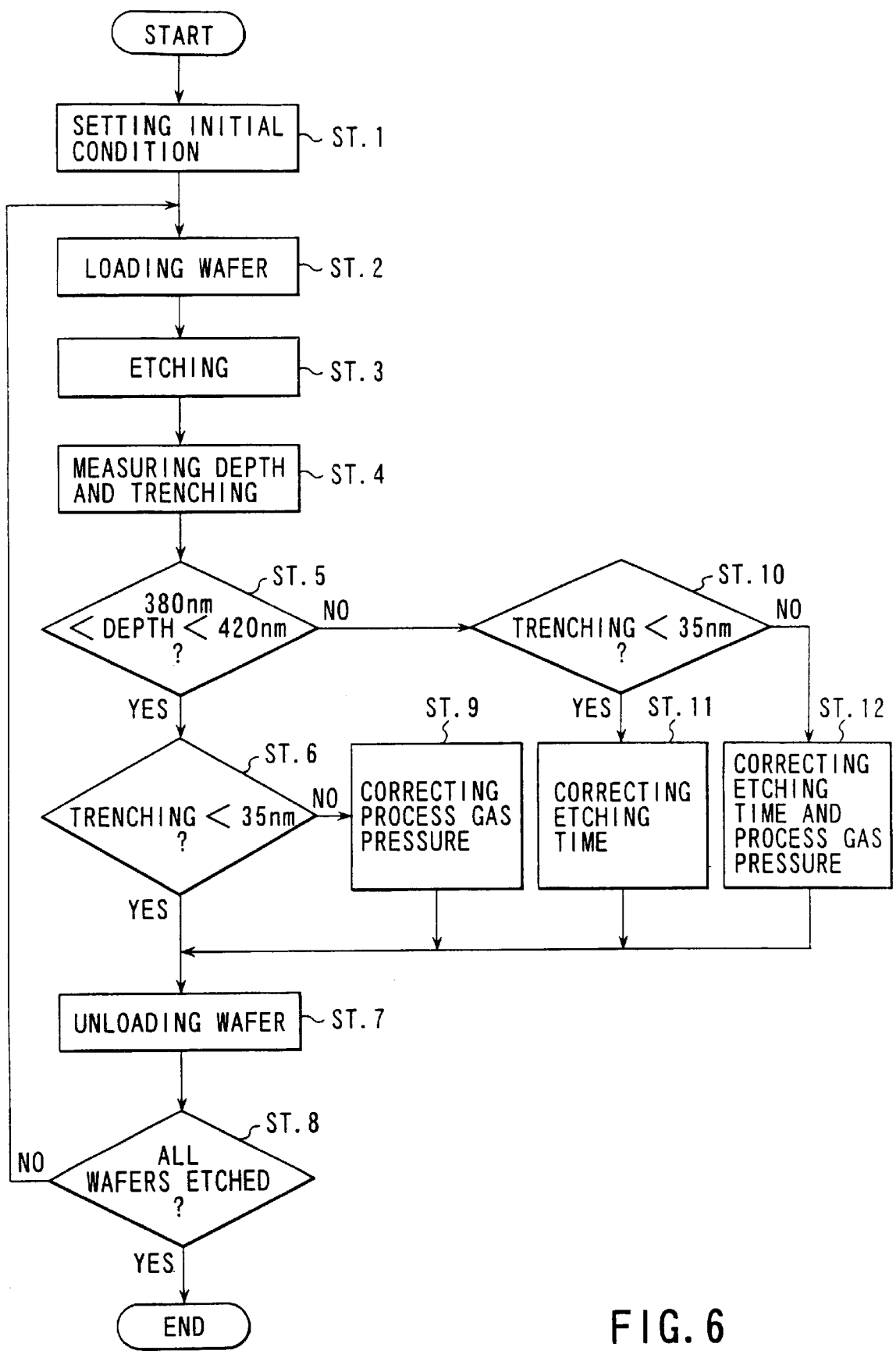
FIG. 6 is a flowchart useful in explaining an example of a control operation performed by a controller incorporated in the manufacturing equipment of the first embodiment.

FIG. 6 is a flowchart useful in explaining an example of a control operation performed by the controller 203.

As is shown in FIG. 6, initial etching conditions are set (ST. 1). The initial etching conditions include, for example, the kind and the pressure of a process gas, the etching period in time, etc. These conditions are determined in light of the width and depth of the wiring trench, a to-be-etched material, etc. In the first embodiment, the width and depth of the wiring trench are 0.2 $\mu$m and 400 nm, respectively, and the to-be-etched material is silicon dioxide. In light of them, $CF_4/O2/Ar=80SCCM/20SCCM/20SCCM/160SCCM$ was used as the process gas, the pressure of the process gas was set at 40 mTorr, and the etching period in time was set at 65 seconds.

Figures 7, 8:
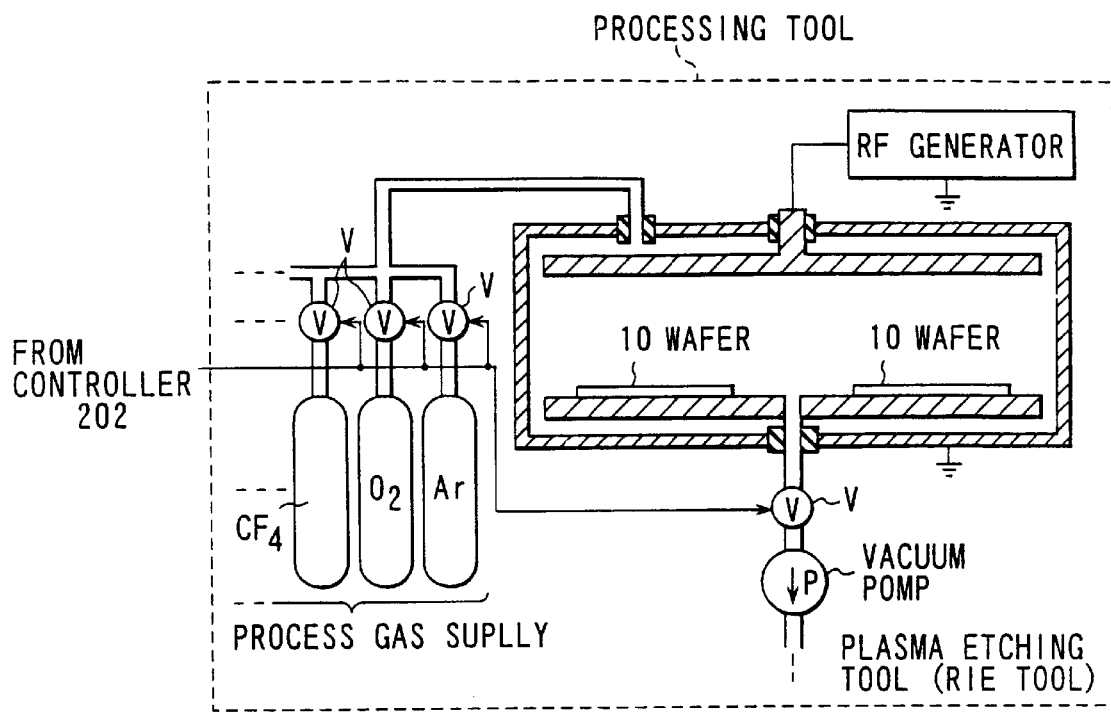
FIG. 7 is a block diagram showing a process apparatus incorporated in the manufacturing equipment according to the first embodiment.
FIG. 8 is a view of a table which shows an example of a data file.

Subsequently, the semiconductor workpiece shown in FIG. 5B (corresponding to "wafer" in FIG. 6) was loaded into a plasma-assisted etching (hereinafter referred to "P-etching") tool (ST. 2). The P-etching tool is the processing tool 201, and an example thereof is shown in FIG. 7. The P-etching tool shown in FIG. 7 is a parallel-plate type RIE tool.

After that, the semiconductor workpiece shown in FIG. 5B was subjected to RIE under the initial etching conditions, thereby forming a wiring trench 27 in the interlayer insulating film 22 (ST. 3). FIG. 5C shows a cross section of the semiconductor workpiece obtained after the etching.

A phenomenon will often occur, in which the depth "$D_{EDGE}$" of an edge portion of the wiring trench 27 is deeper than that "$D_{CENTER}$" of a central portion of the trench, as is shown in broken line circles 28 of FIG. 5C. This phenomenon is generally called "trenching".

In the first embodiment, the semiconductor workpiece shown in FIG. 5C was set in a RIE tool, and the depths "$D_{EDGE}$" and "$D_{CENTER}$" were simultaneously measured by the monitor 202. As a result, the depths "$D_{EDGE}$" and "$D_{CENTER}$" were 400 rim and 380 nm, respectively. Then, "$D_{EDGE}-D_{CENTER}$" was calculated, thereby obtaining the amount of "trenching". That is, the "trenching" amount was 20 nm (ST. 4). After that, it is determined whether or not the amount of "trenching" falls within an appropriate range. In the first embodiment, the appropriate range of the depth of the wiring trench 27 was set at 380–420 nm, while the appropriate range of the "trenching" amount was set at 35 nm or less.

Specifically, it is determined at a step ST. 5 whether or not the depth of the wiring trench 27 falls within the appropriate range. If the answer to the question of the step ST. 5 is YES, the process proceeds to a step ST. 6, where it is determined whether or not the "trenching" amount falls within the appropriate range. If the answer to the question of the step ST. 6 is YES, the process proceeds to a step ST. 7, where the semiconductor workpiece shown in FIG. 5C is unloaded from the RIE tool. Subsequently, the process proceeds to a step ST. 8, where it is determined whether or not all semiconductor workpieces have been etched. If the answer is YES, the process for forming the wiring trench is finished. If, on the other hand, the answer to the question of the step ST. 8 is NO, the process returns to the step ST. 2, where the next semiconductor workpiece is loaded into the RIE tool, thereby repeating the aforementioned steps under the same etching conditions.

If it is determined at the step ST. 6 that the "trenching" amount does not fall within the appropriate range, i.e. if the answer to the question of the step ST. 6 is NO, the process proceeds to a step ST. 9, where the pressure of the process gas is changed. This change is executed with reference to the contents of a data file 204 read by the controller 203.

FIG. 8 is a view of a table which shows an example of the data file 204. In this figure, only part of the contents of the data file 204 is shown.

As is shown in FIG. 8, the data file 204 stores standard values, for each process gas pressure, of the "trenching" amount, the etching rate (for each trench width), the selectivity of the photoresist, the inplane uniformity of the wafer, etc. If it is determined at the step ST. 6 that the "trenching" amount is not appropriate, the pressure of the process gas is increased by, for example, 5 mTorr, with reference to the data file 204, so as to reduce the "trenching" amount. This instruction is output from the controller 202 to a valve group V incorporated in the RIE tool shown in FIG. 7. Since the depth of the wiring trench 27 is determined appropriate at the step ST. 9, the etching period in time is unchanged basically. However, the etching rate is liable to increase when the pressure of the process gas increases, as is understood from FIG. 8. Therefore, the etching time period may be changed if necessary.

After changing the etching conditions, the process proceeds to the step ST. 7, where the semiconductor workpiece shown in FIG. 5C is unloaded from the RIE tool. Then, the process proceeds to the step ST. 8, where it is determined whether all semiconductor workpieces have been etched. If the answer is YES, the process for forming the wiring trench 27 is finished. If, on the other hand, the answer is NO, the process returns to the step ST. 2, the next semiconductor workpiece is loaded into the RIE tool, thereby repeating the aforementioned steps under the changed etching conditions.

Further, if it is determined at the step ST. 5 that the depth of the wiring trench 27 is not appropriate, i.e. if the answer to the question of the step ST. 5 is NO, the process proceeds to a step ST. 10, where it is determined whether the "trenching" amount is appropriate. If the answer is YES at the step ST. 10, the process proceeds to a step ST. 11, thereby changing the etching time period. For example, if it is determined at the step ST. 5 that the depth of the wiring trench 27 is shallower than 380 nm, the etching time period is lengthened to make the wiring trench 27 deeper. On the other hand, if it is determined that the depth of the wiring trench 27 is deeper than 420 nm, the etching time period is shortened to make the wiring trench 27 shallower. This change is also executed with reference to the contents, specifically to the etching rate, of the data file 204. Since in this case, the "trenching" amount is determined appropriate at the step ST. 11, the pressure of the process gas is unchanged basically.

After changing the etching conditions, the process proceeds to the step ST. 7, thereby unloading the semiconductor workpiece shown in FIG. 5C from the RIE tool. Thereafter, the process proceeds to the step ST. 8, thereby determining whether or not all semiconductor workpieces have been etched. If the answer is YES, the process for forming the wiring trench is finished. If the answer is NO, the process returns to the step ST. 2, thereby loading the next semiconductor workpiece into the RIE tool. In this state, the aforementioned steps are repeated under the changed etching conditions.

Moreover, it is determined at the step ST. 10 that the "trenching" amount is not appropriate, i.e. if the answer is NO at the step ST. 10, the process proceeds to a step ST. 12, where both the etching time period and the process gas pressure are changed. This change is also executed with reference to the contents of the data file 204.

After changing the etching conditions, the process proceeds to the step ST. 7, thereby unloading the semiconductor workpiece shown in FIG. 5C from the RIE tool. Thereafter, the process proceeds to the step ST. 8, thereby determining whether or not all semiconductor workpieces have been etched. If the answer is YES, the process for forming the wiring trench is finished. If the answer is NO, the process returns to the step ST. 2, thereby loading the next semiconductor workpiece into the RIE tool. In this state, the aforementioned steps are repeated under the changed etching conditions.

After unloading the semiconductor workpiece shown in FIG. 5C from the RIE tool, the photoresist film 23 is removed.

Thereafter, tantalum nitride (TaN) is sputtered onto the interlayer insulating film 22 to form a TaN film 29, as is shown in FIG. 5D. Since the TaN film 29 is formed by sputtering, the step coverage is not so good as a thin film deposited by P-CVD. Accordingly, where the "trenching" amount is large, it is possible that the portion indicated by each broken line circle 28 will not sufficiently be covered, the film quality of the portion indicated by each broken line circle 28 will be degraded. Since the TaN film 29 is a barrier film for enhancing the adhesion between the interlayer insulating ($SiO_2$) film 22 and Cu wiring to be formed in the next step, or for suppressing diffusion of Cu into the interlayer insulating film 22, it is important in the first embodiment to measure the depths "$D_{EDGE}$" and "$D_{CENTER}$" of the wiring trench 27 to monitor the "trenching" amount.

Figure 5E:
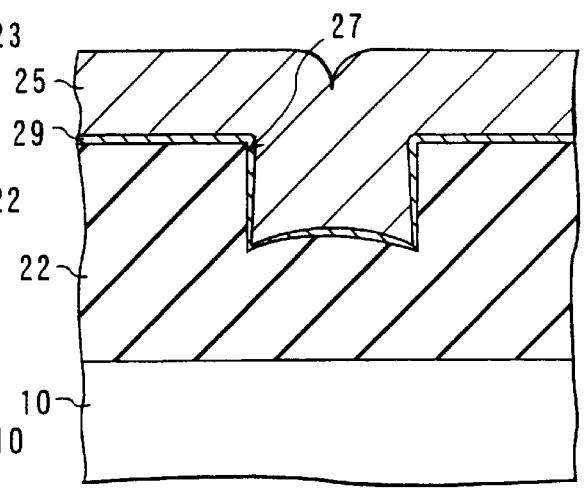
Figure 5C:
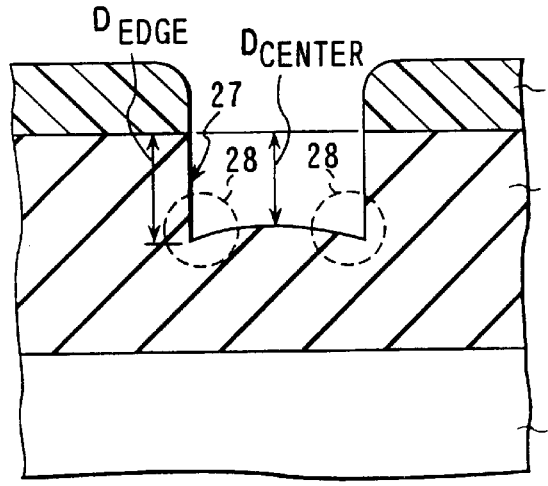
Figure 5F:
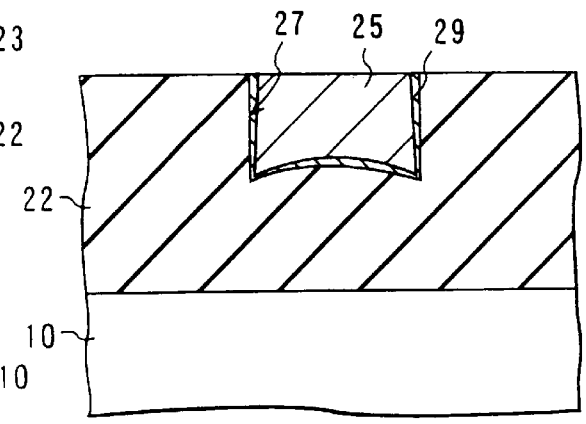

After that, Cu is plated onto the TaN film 29 to form a Cu film 25, as is shown in FIG. 5E.

Then, the Cu film 25 is subjected to CMP, thereby filling the wiring trench 27 with it. Thus, damascene wiring is formed in the wiring trench 27.

As described above, in the first embodiment, the depths of plural portions of the wiring trench 27 are simultaneously measured, the "trenching" phenomenon can be detected. It should be noted that "trenching" cannot be detected by the conventional measuring device shown in FIG. 1, since the device measures the depth of only one portion of the wiring trench 27.

Moreover, in the first embodiment, "trenching" is detected and the detection result is fed, as information for adjusting the etching conditions, back to the controller 202. This enables suppression of excessive reduction of the manufacture yield. In addition, if the detection result is fed back to the controller 202 in a real time manner, excessive reduction of the manufacture yield can be suppressed while suppressing reduction of the throughput.

It is a matter of course that the first embodiment can be used not only in the actual manufacturing process, but also to detect an abnormality in the RIE tool or to optimize the process conditions.

Although the first embodiment uses the P-etching tool as the processing tool 201, another type of etching tool such as a chemical dry etching (CDE) tool or a wet etching tool can be used as the processing tool 201, depending upon a target shape into which a semiconductor workpiece is to be processed.

Also, a film thickness measuring device disclosed in Japanese Patent Application KOKAI Publication No.10-47926 can be used as the monitor 202 as well as the device shown in FIG. 4.

Second Embodiment

A second embodiment, in which the invention is applied to a P-CVD tool, will be described.

Figure 9:
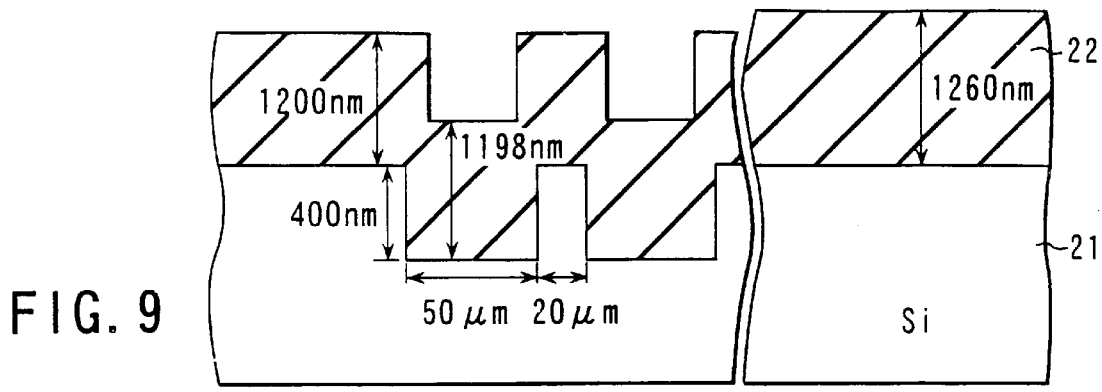
FIG. 9 is a sectional view showing an example of a workpiece processed by a manufacturing equipment according to a second embodiment.

FIG. 9 is a sectional view showing an example of a workpiece processed by a manufacturing equipment according to the second embodiment. The equipment of the second embodiment is obtained by using a P-CVD tool as the processing tool 201.

As is shown in FIG. 9, trenches 30 with a width of 50 $\mu$m and a depth of 400 nm were formed at intervals of 20 $\mu$m in a to-be-processed surface of an Si wafer 21. $SiO_2$ was deposited on the to-be-processed surface of the wafer 21 using the P-CVD tool, thereby forming an $SiO_2$ film 22. The thickness distribution of the $SiO_2$ film 22 was measured by the film thickness measuring method employed in the first embodiment, while the film forming was continued by the P-CVD method. It was detected that the thickness of the $SiO_2$ film 22 on that portion of the wafer 21, which was located away from the trenches 30, was 1260 nm. On the other hand, the thickness of the film 22 on the trenches 30 was 1198 nm, and the thickness of the film 22 on that portion of the wafer 21, which was close to the trenches 30, was 1200 nm. Thus, it was confirmed that the $SiO_2$ film 22 was thinner on the trenches 30 than on other portions of the wafer as a result of the microscopic loading effect.

This embodiment can detect variations in the thickness of the $SiO_2$ film 22, i.e. "microscopic loading", where the $SiO_2$ film 22 (i.e. a thin film) is formed on a to-be-processed surface which has a step. If the detection result is fed, as information for adjusting the depositing conditions, back to the controller 202, excessive reduction of the manufacture yield can be suppressed.

Moreover, if the detection result is fed back to the controller 202 in a real time manner, excessive reduction of the manufacture yield can be suppressed while suppressing reduction of the throughput.

It is a matter of course that the second embodiment, as well as the first embodiment, can be used not only in the actual manufacturing process, but also to detect an abnormality in the P-CVD tool or to optimize the process conditions.

Although the second embodiment uses the P-CVD tool as the processing tool 201, another type of tool such as a sputtering tool, a plating tool, etc. can be used as the processing tool 201, depending upon the material of the thin film.

Third Embodiment

A third embodiment, in which the invention is applied to a CMP tool, will be described.

Figure 10:
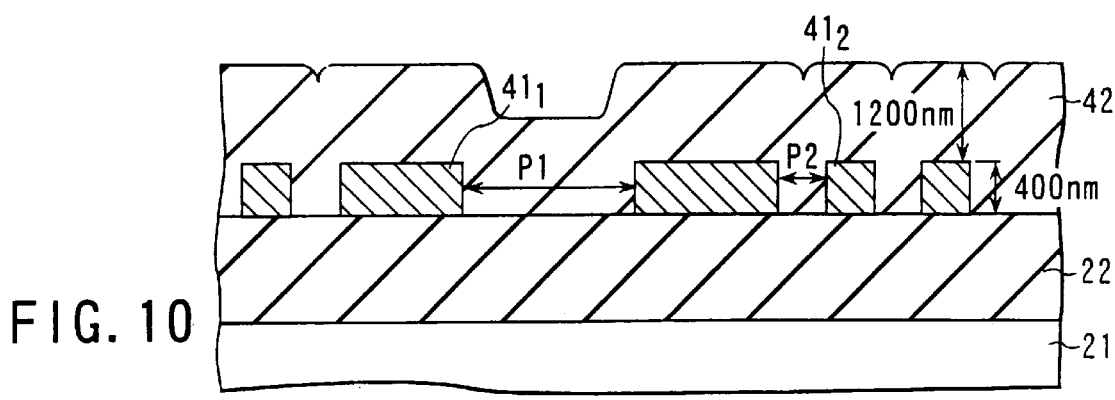
FIGS. 10, 11A and 11B are sectional views useful in explaining a process performed by a manufacturing equipment according to a third embodiment.

FIG. 10 is a sectional view showing a workpiece used in the third embodiment. A manufacturing equipment according to the third embodiment is obtained by using a CMP tool as the processing tool 201.

As is shown in FIG. 10, a $SiO_2$ film 22 is formed on a Si wafer 21. A plurality of aluminum (Al) wires 41 with a thickness of 400 nm are provided on the $SiO_2$ film 22. The Al wires 41 include wires $41_1$ with a wide width and wires $41_2$ with a narrow width. Further, the Al wires 41 are arranged at wide and narrow gaps P1 and P2, and coated with an $SiO_2$ film 42 of a thickness of 1200 nm. There is a step or depression in the $SiO_2$ film 42 above the wide gap P1. When the $SiO_2$ film 42 with a step is subjected to CMP, "dishing" may occur. The "dishing" is caused by pressure applied from, in particular, the polishing pad to a surface to be chemically mechanically polished, i.e. the $SiO_2$ film 42. After the CMP treatment, the thickness distribution of the $SiO_2$ film 42 is measured by the film thickness measuring method employed in the first embodiment.

A specific example of a process performed by the manufacturing equipment of the third embodiment will now be described. This example relates to the conditioning of the CMP tool. Specifically, the relationship between the size of grinding particles for conditioning the polishing pad, and the degree of "dishing" was examined, and was used for optimization of the process.

In this embodiment, a diamond conditioner (I) with a particle size of 80 $\mu$m and a diamond conditioner (II) with a particle size of 250 $\mu$m were used as grinding particles.

Figure 11A:
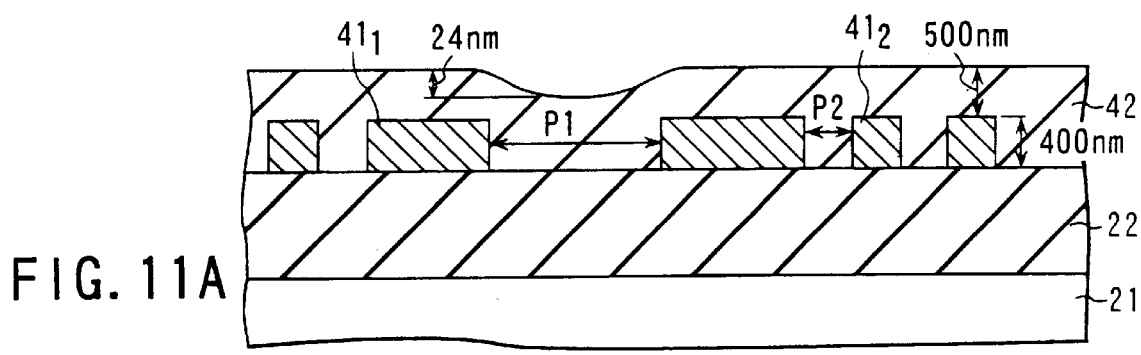

First, the polishing pad was conditioned for fifteen seconds using the diamond conditioner (I). After that, the $SiO_2$ film 42 shown in FIG. 10 was chemically mechanically polished by 700 nm. FIG. 11A shows a cross section of the workpiece after CMP.

As is shown in FIG. 11A, the "dishing" degree of the $SiO_2$ film 42, after CMP was performed thereon using the polishing pad conditioned with the diamond conditioner (I), was 24 nm.

Figure 11B:
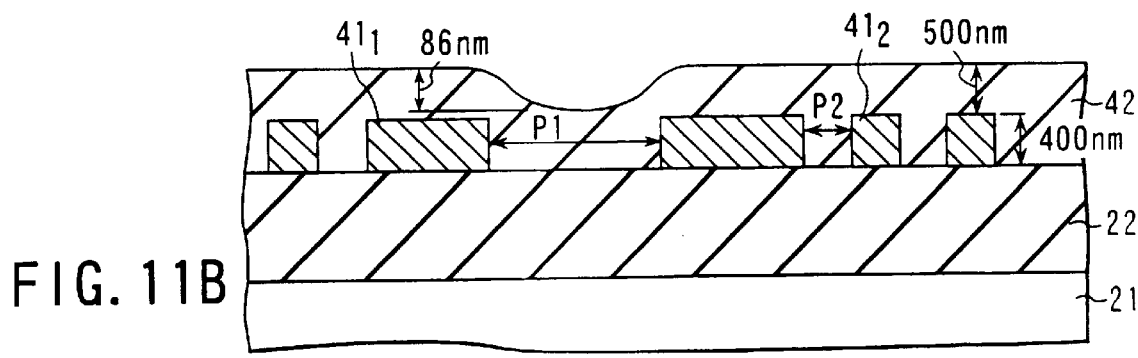

On the other hand, the polishing pad was conditioned for fifteen seconds using the diamond conditioner (II). After that, the $SiO_2$ film 42 shown in FIG. 10 was chemically mechanically polished by 700 nm. FIG. 11B shows a cross section of the workpiece after CMP.

As is shown in FIG. 11B, the "dishing" degree of the $SiO_2$ film 42, after CMP was performed thereon using the polishing pad conditioned with the diamond conditioner (II), was 86 nm.

As described above, it was found that the use of the diamond conditioner (I) to condition the polishing pad before CMP reduces the "dishing" degree of the $SiO_2$ film 42.

Further, it was found that the degree of "dishing" differs if the pressure applied to the conditioner during conditioning changes.

Further, it was also found that there is a difference in the degree of "dishing" between a case where the $SiO_2$ film 42 is chemically mechanically polished by 700 nm at a time after the polishing pad is conditioned using the diamond conditioner (I), and a case where the $SiO_2$ film 42 is chemically mechanically polished first by 350 nm after the polishing pad is conditioned, and further chemically mechanically polished by 350 nm (accordingly, polished by 700 nm in total) after the polishing pad is conditioned again.

Where the $SiO_2$ film 42 was chemically mechanically polished by 700 nm at a time, "dishing" of 24 nm occurred. On the other hand, where the film was chemically mechanically polished in two stages, by 350 nm in each stage, "dishing" of 43 nm occurred. Performing the CMP treatment in two stages means, for example, a case where the $SiO_2$ film 42 is once subjected to CMP, and if the thickness of the resultant film is thicker than a target value, the film is again subjected to CMP.

The "dishing" phenomenon on the $SiO_2$ film 42, which will be described in detail in the next, fourth, embodiment, will cause "metal residue" in the damascene process. To avoid this, it is important to detect "dishing" on the $SiO_2$ film 42 and to feed the result of detection back to the process conditions for reducing the degree of "dishing". As described above, "dishing" can be reduced by changing the conditioning conditions.

As described above, the "dishing" degree of the processed surface can be detected in the third embodiment. Detection of the "dishing" degree is effective to optimize the process conditions.

Also, the third embodiment is effective to manage the actual manufacturing process, as the first and second embodiments, and to detect an abnormality in the polishing pad.

Fourth Embodiment

A manufacturing equipment according to a fourth embodiment is obtained by using a CMP tool as the processing tool 201 shown in FIG. 2 like the third embodiment.

Referring first to FIGS. 12A–12D and 13A–13D, "metal residue" which occurs in the damascene process will be described.

FIGS. 12A–12D are plan views useful in explaining a process performed by the manufacturing equipment of the fourth embodiment. FIGS. 13A–13D are sectional views taken along lines 13A–13A–13D–13D in FIGS. 12A–12D, respectively. More specifically, FIGS. 12A–12D and 13A–13D show a damascene process.

Figure 12A:
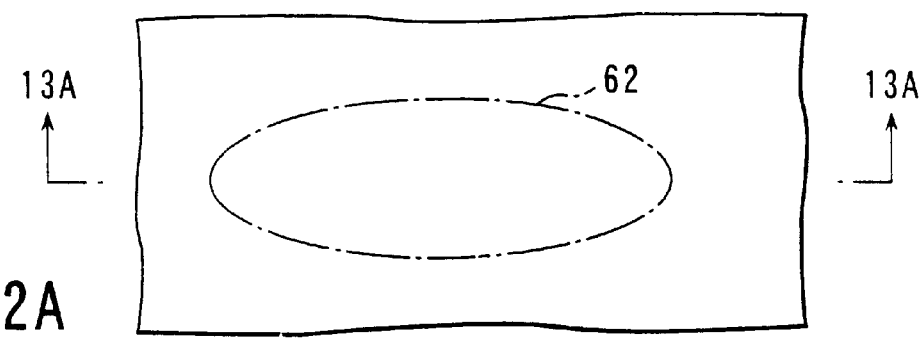
FIGS. 12A, 12B, 12C and 12D are plan views useful in explaining a process performed by a manufacturing equipment according to a fourth embodiment.
Figure 13A:
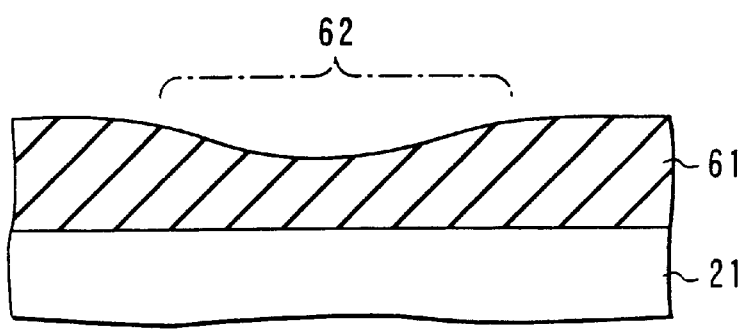
FIGS. 13A, 13B, 13C and 13D are sectional views useful in explaining a process performed by the manufacturing equipment according to the fourth embodiment.

As is shown in FIGS. 12A and 13A, an $SiO_2$ film 61 is formed on an Si wafer 21, and "dishing", which is illustrated in FIGS. 11A and 11B, is seen on the surface of the film 61. Reference numeral 62 denotes the area in which the "dishing" has occurred.

Figure 12B:
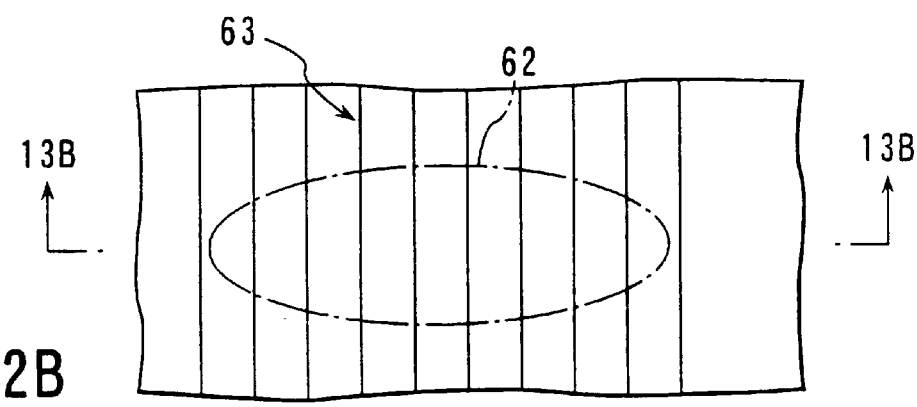
Figure 13B:
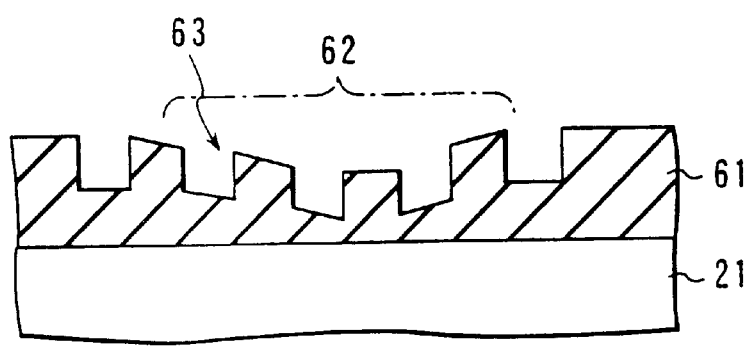

Referring then to FIGS. 12B and 13B, a photoresist film (not shown), which has openings corresponding to the wiring trench pattern, is formed on the $SiO_2$ film 61 by lithography. Subsequently, the $SiO_2$ film 61 is etched by RIE using the photoresist film as a mask, thereby forming wiring trenches 63.

Figure 12C:
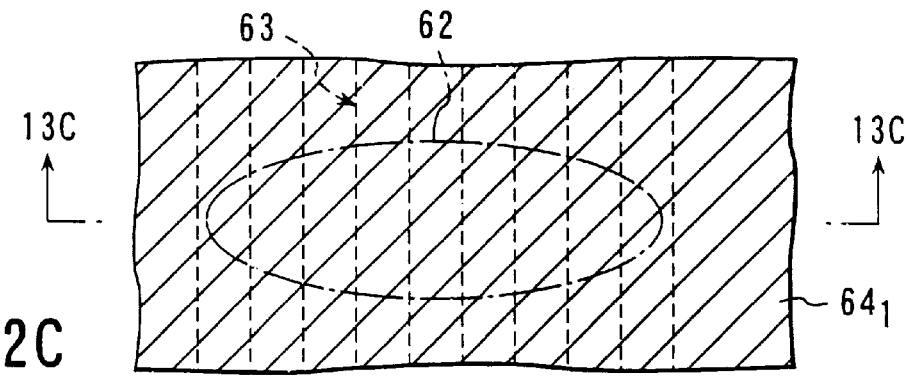
Figure 13C:
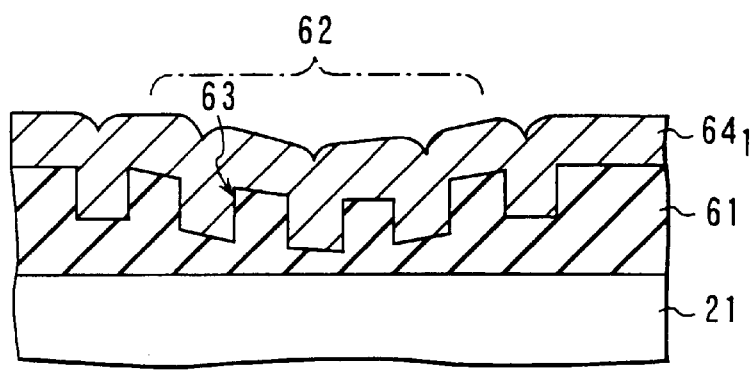

After that, as shown in FIGS. 12C and 13C, tungsten (W) is deposited on the structure shown in FIGS. 12B and 13B, thereby forming a W film $64_1$.

Figure 12D:
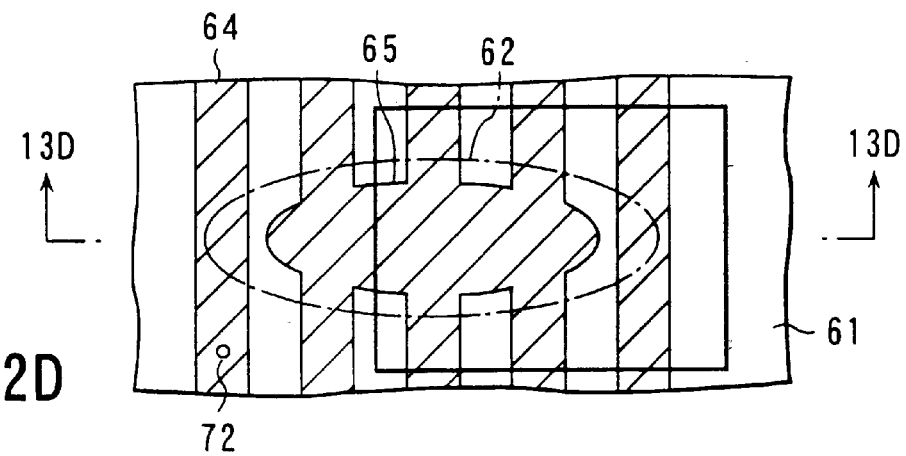
Figure 13D:
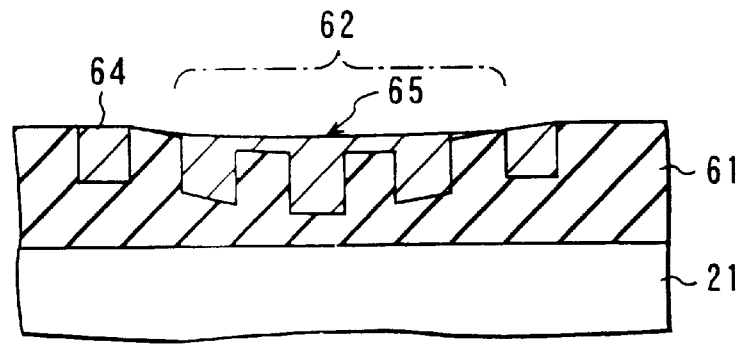

Referring then to FIGS. 12D and 13D, the W film 64, is chemically mechanically polished, thereby burying the W film into the wiring trenches 63. Thus, damascene wiring 64 is formed in the wiring trenches 63. Since, however, the top surface of the $SiO_2$ film 61 which is located in the dishing area 62 is lower than the other surface portions, tungsten remains in the dishing area 62. This is a "metal residue" phenomenon. Reference numeral 65 denotes the area in which "metal residue" has occurred.

Figure 1:
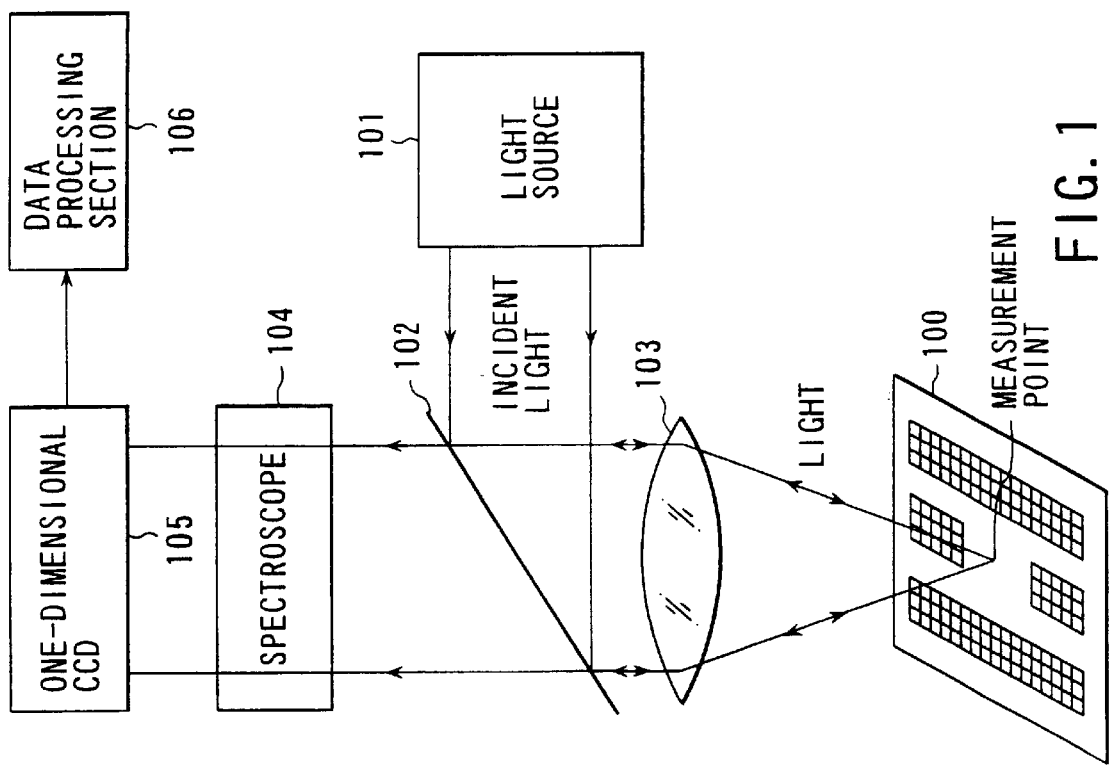
FIG. 1 is a block diagram showing the structure of a measurement apparatus as the background art of the present invention.

When the shape of the processed surface of a semiconductor workpiece shown in FIGS. 12D and 13D is monitored, i.e. when the measuring apparatus shown in FIG. 1 measures the thickness of the damascene wiring 64, it measures only the thickness at a measurement point 72. Accordingly, if the metal remaining area 65 is not located at the measurement point 72, the "metal residue" cannot be detected.

On the other hand, the monitor 202 detects a "metal residue" within a measurement field 71.

A description will be given of a process performed by the manufacturing equipment of the fourth embodiment. This process relates to the damascene process, and more particularly to the process for burying a metal into a wiring trench.

Figure 14:
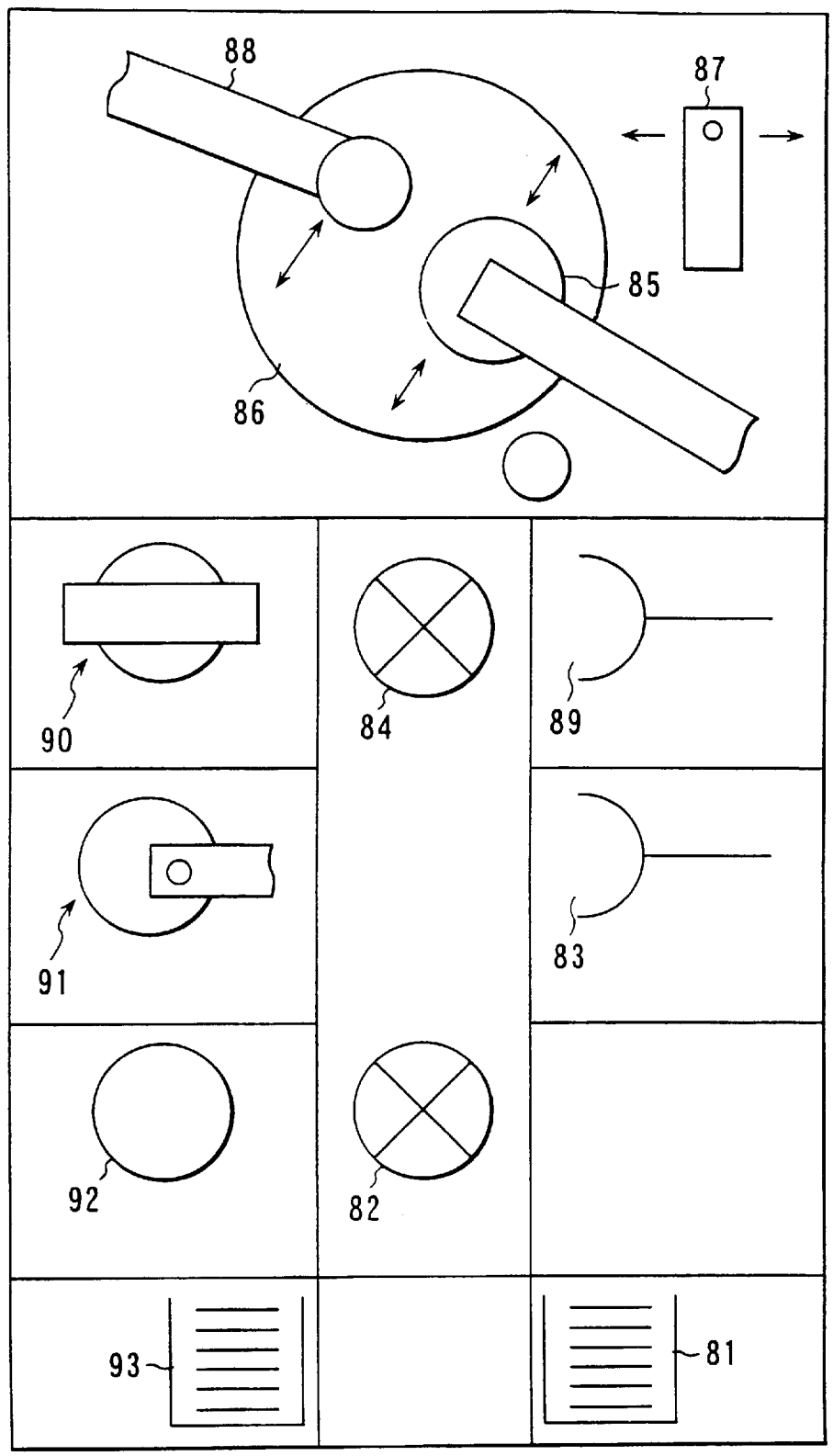
FIG. 14 is a view showing an example of the manufacturing equipment of the fourth embodiment.
Figure 15:
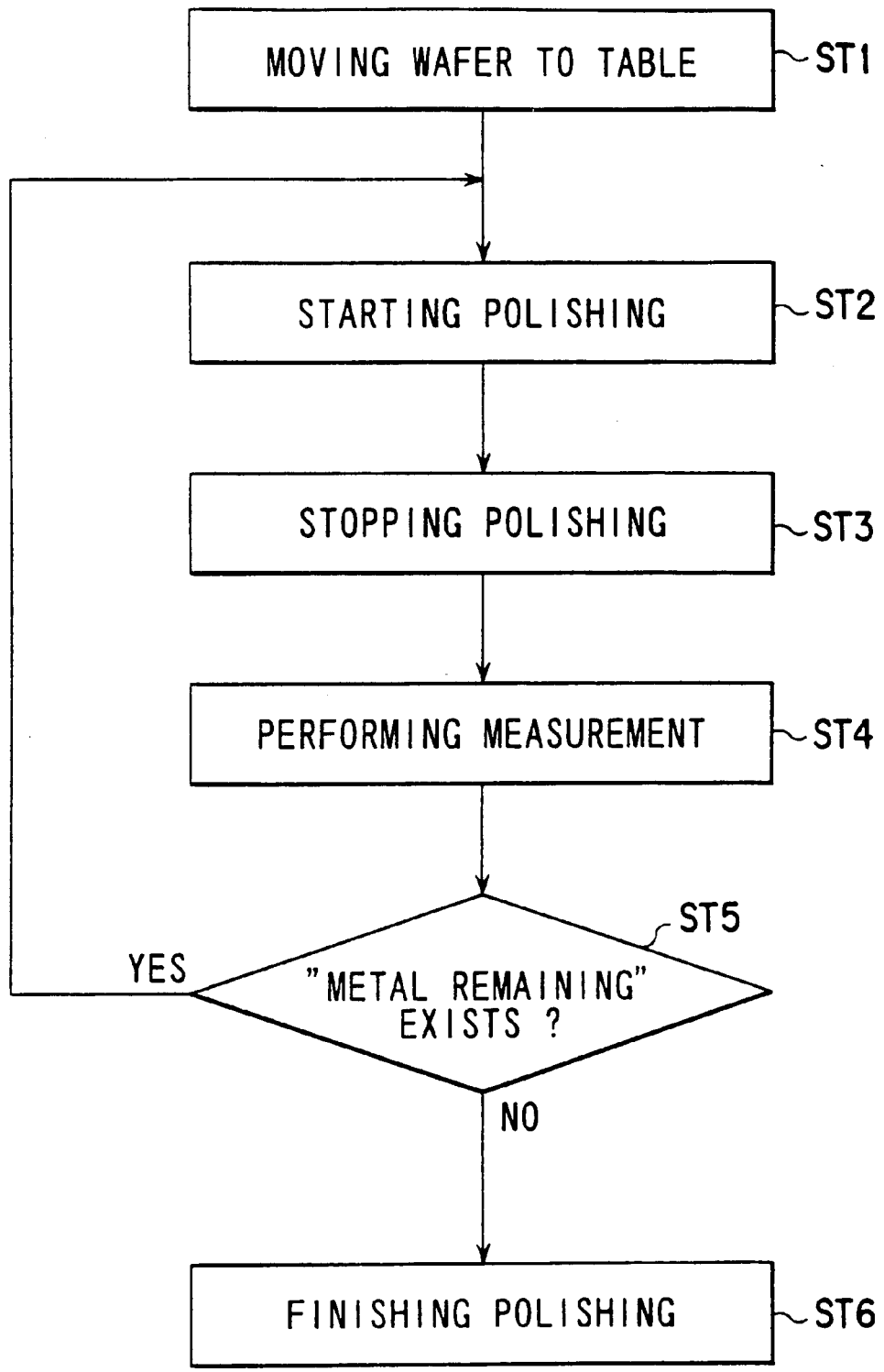
FIG. 15 is a flowchart useful in explaining an example of a control operation performed by a controller incorporated in the manufacturing equipment of the fourth embodiment.

FIG. 14 illustrates the structure of the manufacturing equipment of the fourth embodiment. FIG. 15 is a flowchart useful in explaining a control operation performed by the manufacturing equipment of the fourth embodiment.

As is shown in FIGS. 14 and 15, the wafers are accommodated in a wafer cassette A81 before CMP. A robot A82 takes a wafer out of the wafer cassette A81, and transfers it to a reversing machine A83. The reversing machine A83 reverses the transferred wafer. A robot B84 receives the reversed wafer and transfers it to a wafer carrier 85. The wafer carrier 85 is moved to a position above a table 86 and then lowered (ST. 1). As a result, the wafer is made to contact the table 86. Subsequently, the table 86 is rotated to start CMP of the wafer (ST. 2). After a predetermined time elapses, the table 86 is stopped to thereby stop the CMP of the wafer (ST. 3). Then, the wafer carrier 85 is raised to separate the wafer from the table 86. After that, a sensor head 87 is moved to a position below the wafer, thereby performing a measurement to confirm the occurrence of "metal residue" (ST. 4).

The sensor head 87 has the same structure as that shown in FIG. 4, and is disposed in this embodiment to detect "metal residue" from a two-dimensional image picked by the area image sensor 15. More specifically, to detect the "metal residue", it suffices if changes in the contrast of the two-dimensional image, or the reflectances are measured. Further, in light of the fact that the thickness of the $SiO_2$ film 61 cannot be detected in the "metal residue" area, the "metal residue" can also be detected by detecting occurrence of a measurement error during the measurement of the $SiO_2$ film 61.

Thereafter, if it is determined at a step ST. 5 whether "metal residue" exists. If the "metal residue" exists (YES), the sensor head 87 is retreated from above the table 85, and the wafer carrier 85 is lowered, thereby repeating the steps ST. 2–ST. 5. In other words, the wafer is again subjected to CMP.

If, on the other hand, "metal residue" does not exist (NO), the sensor head 87 is retreated from above the table 85, a robot B84 is used to transfer the wafer from the wafer carrier 85 to a reversing machine B89. The reversing machine B89 reverses the transferred wafer. The robot B84 receives the reversed wafer and transfers it to a cleaner A90, which in turn cleans it. The robot B84 then transfers the cleaned wafer to a cleaner B91, which in turn cleans it. The robot A82 transfers the cleaned wafer to a spin dryer 92, which in turn dries it. After that, the robot A82 stores the chemically mechanically polished wafer into a wafer cassette B93.

The fourth embodiment can detect "metal residue" without extending the time required for the process. Upon detection the "metal residue", it can be removed by repeating the CMP treatment. As a result, the manufacture yield can be increased.

In the above-described first through fourth embodiments, the shape of the processed surface is measured by performing measurement in a predetermined "field" of the surface, which provides various advantages as described above. The measurement of the processed surface based on the "field" is also advantageous in throughput. Where the shape of the processed surface is measured by performing measurement at a predetermined "point" of the surface, usually, three alignment operations, i.e. alignment of the notch of a wafer, rough alignment of the wafer and fine alignment of the wafer, are necessary before performing measurement at a predetermined "measurement point".

On the other hand, where the shape of the processed surface is measured on the basis of a "field" of the surface, only one alignment operation, i.e. only rough alignment, is sufficient to perform measurement in a predetermined "measurement field". Since thus, the number of alignment operations is smaller than in the case of performance measurement at a point, the resultant throughput is higher.

The invention is not limited to the above-described embodiments, but may be modified in various manners without departing from its scope.

As described above, the invention can detect, in a short time, three-dimensional states such as "trenching", "microscopic loading", "dishing", "metal residue", etc., which previously could not be detected or required a lot of time to detect. By supplying, in a feedback manner, the controller 203 with the detection result as information for controlling the processing tool 201, the semiconductor manufacturing equipment can show a high manufacture yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:
    polishing a to-be-polished surface of a semiconductor workpiece to a target shape, using a chemical mechanical polishing (CMP) tool, the to-be-polished surface being a surface of a metal on an insulating film having trenches;
    monitoring a shape of a polished surface of the semiconductor workpiece to determine if a metal residue exists outside of the trenches on the polished surface while the semiconductor workpiece is set in the CMP tool, using a monitor having a sensor that obtains a two-dimensional image of the to-be-polished surfaces; and
    controlling the CMP tool in a feedback manner based on a result of monitoring to determine if the metal residue exists, using a controller.

2. The method according to claim 1, wherein the metal residue is detected by measuring changes in a contrast of the two-dimensional image.

3. The method according to claim 1, wherein the metal residue is detected by measuring a reflectance.

4. The method according to claim 1, wherein the metal residue is detected by measuring a thickness of the insulating film and detecting occurrence of measurement error.

5. The method according to claim 1, wherein the monitor radiates the polished surface with incoherent light, divides light refracted from the polished surface into a plurality of light beams of different wavelengths, acquires a two-dimensional image from each of the divided light beams of different wavelengths, three-dimensionally analyzes the shape of the polished surface, and transmits information on an analysis result to the controller.

6. A method for manufacturing a semiconductor device comprising:
    polishing a to-be-polished surface of a semiconductor workpiece to a target shape, using a CMP tool, the to-be-polished surface being a surface of a metal on an insulating film having trenches;
    monitoring a shape of a polished surface of the semiconductor workpiece to determine if a metal residue exists outside of the trenches on the polished surface while the semiconductor workpiece is set in the CMP tool, using a monitor having a sensor that obtains a two-dimensional image of the to-be-polished surface; and
    controlling the CMP tool in a feedback manner based on a result of monitoring to determine if the metal residue exists, using a controller, the controller adjusting polishing conditions of the CMP tool if the metal residue exists.

7. The method according to claim 6, wherein the metal residue is detected by measuring changes in a contrast of the two-dimensional image.

8. The method according to claim 6, wherein the metal residue is detected by measuring a reflectance.

9. The method according to claim 6, wherein the metal residue is detected by measuring a thickness of the insulating film and detecting occurrence of measurement error.

10. The method according to claim 6, wherein the monitor monitors a polishing amount distribution of the polished surface and the controller adjusts polishing conditions of the CMP tool if a polishing amount of the polished surface deviates from a target polishing amount, so that the target polishing amount can be obtained.

11. The method according to claim 6, wherein the monitor radiates the polished surface with incoherent light, divides light refracted from the polished surface into a plurality of light beams of different wavelengths, acquires a two-dimensional image from each of the divided light beams of different wavelengths, three-dimensionally analyzes the shape of the polished surface, and transmits information on an analysis result to the controller.

12. A method for manufacturing a semiconductor device comprising:
    polishing a to-be-polished surface of a semiconductor workpiece to a target shape, using a CMP tool, the to-be-polished surface being a surface of a metal on an insulating film having trenches;
    monitoring a shape of a polished surface of the semiconductor workpiece to determine if a metal residue exists outside of the trenches on the polished surface while the semiconductor workpiece is set in the CMP tool, using a monitor having a sensor that obtains a two-dimensional image of the to-be-polished surface; and
    controlling the CMP tool in a feedback manner based on a result of monitoring to determine if the metal residue exists, using a controller, the controller adjusting polishing conditions of the CMP tool to re-polish the polished surface if the metal residue exists.

13. The method according to claim 12, wherein the metal residue is detected by measuring changes in a contrast of the two-dimensional image.

14. The method according to claim 12, wherein the metal residue is detected by measuring a reflectance.

15. The method according to claim 12, wherein the metal residue is detected by measuring a thickness of the insulating film and detecting occurrence of measurement error.

16. The method according to claim 12, wherein the monitor monitors a shape of the polished surface and the controller controls the CMP tool to re-polish the polished surface if the shape after polishing does not reach the target shape.

17. The method according to claim 12, wherein the monitor radiates the polished surface with incoherent light, divides light refracted from the polished surface into a plurality of light beams of different wavelengths, acquires a two-dimensional image from each of the divided light beams of different wavelengths, three-dimensionally analyzes the shape of the polished surface, and transmits information on an analysis result to the controller.

* * * * *

UNITED STATES PATENT AND TRADEMARK OFFICE
CERTIFICATE OF CORRECTION

PATENT NO. : 6,723,572 B2
DATED : April 20, 2004
INVENTOR(S) : Yano et al.

It is certified that error appears in the above-identified patent and that said Letters Patent is hereby corrected as shown below:

Column 11,
Line 61, change "surfaces;" to -- surface; --

Signed and Sealed this

Twenty-ninth Day of June, 2004

JON W. DUDAS
*Acting Director of the United States Patent and Trademark Office*